United States Patent
Hessel et al.

(10) Patent No.: US 7,036,065 B2
(45) Date of Patent: Apr. 25, 2006

(54) ARQ COMBINING HOLDOFF SYSTEM AND METHOD

(75) Inventors: Clifford Hessel, Rochester, NY (US); Paul E. Voglewede, Churchville, NY (US)

(73) Assignee: Harris Corporation, Melbourne, FL (US)

(*) Notice: Subject to any disclaimer, the term of this patent is extended or adjusted under 35 U.S.C. 154(b) by 480 days.

(21) Appl. No.: 10/098,470

(22) Filed: Mar. 18, 2002

(65) Prior Publication Data

US 2003/0177429 A1 Sep. 18, 2003

(51) Int. Cl.
*G06F 11/00* (2006.01)

(52) U.S. Cl. ........................... 714/746; 714/799
(58) Field of Classification Search ................ 714/746, 714/748
See application file for complete search history.

(56) References Cited

U.S. PATENT DOCUMENTS

| | | | | |
|---|---|---|---|---|
| 4,519,068 A | * | 5/1985 | Krebs et al. | 370/329 |
| 5,629,948 A | * | 5/1997 | Hagiwara et al. | 714/748 |
| 5,968,197 A | | 10/1999 | Doiron | |
| 5,982,808 A | * | 11/1999 | Otto | 375/139 |
| 5,983,382 A | | 11/1999 | Pauls | |
| 6,128,763 A | | 10/2000 | LoGalbo et al. | |
| 6,301,681 B1 | * | 10/2001 | Chen et al. | 714/751 |
| 6,704,898 B1 | * | 3/2004 | Furuskar et al. | 714/751 |
| 2001/0056560 A1 | * | 12/2001 | Khan et al. | 714/746 |
| 2002/0049068 A1 | * | 4/2002 | Koo et al. | 455/522 |
| 2002/0196812 A1 | * | 12/2002 | Yamaguchi et al. | 370/474 |

OTHER PUBLICATIONS

"A Hybrid ARQ Scheme for DS-CDMA Mobile Data Communications", H. Zhao et al., 1996 5th IEE International, vol. 1, Sep. 29-Oct. 2, 1996, pp 71-75.*

(Continued)

*Primary Examiner*—Albert Decady
*Assistant Examiner*—John P. Trimmings
(74) *Attorney, Agent, or Firm*—Duane Morris LLP

(57) ABSTRACT

A system and method for demodulating a data packet in an automatic repeat request communication system is disclosed. Specifically, in a communication system that combines the energy of an initially transmitted data packet with the energy of a retransmitted version of the data packet, the inventive system and method measures the "usability" of the initially transmitted data packet that fails an error-checking procedure and the "usability" of a retransmitted version of the data packet. If the initially transmitted version and the retransmitted version of the data packet are both "usable", the energies of the data packets are combined. The combined data packet is then subjected to the error-checking procedure. If the combined data packet fails the error-checking procedure, the energy of either the combined packet or the retransmitted packet is stored for later combination with a subsequently-retransmitted version of the data packet.

31 Claims, 8 Drawing Sheets

OTHER PUBLICATIONS

"A modified Selective-Repeat Type-II Hybrid ARQ System and Its Performance Analysis", Y. Wany et al., IEEE Transactions on Communications, vol. com-31, No. 5, May 1983.*

"Packet Combining Systems Based on the Viterbi Decoder", B. Harvey et al., IEEE Transactions on Communications, vol. 42 No. 2/3/4, Feb./Mar./Apr. 1994, pp 1544-1557.*

"CMOS Circuit Realization of a Truncated Viterbi Decoder Usibg Pipeline Technique", H. Ali et al., Eighteenth Nationsl Radio Science Conference, Mar. 27-29, 2001, Mansoura Univ., Egypt.*

* cited by examiner

ARQ COMBINING HOLDOFF SYSTEM AND METHOD

BACKGROUND OF THE INVENTION

The present invention relates to a system and method for demodulating a data packet in a communication system using automatic repeat request ("ARQ") protocol, specifically an ARQ communication system that combines the energy of an initially transmitted data packet with the energy of a retransmitted version of the data packet. The inventive system and method measures the "usability" of each data packet if the data packet does not pass an error-checking procedure. If a data packet is determined to be "usable", the energy of the data packet is stored and/or combined with the energy of a previously received version of the same data packet that has been determined to be "usable". The combined data packet may then be combined with a subsequently received version of the same data packet and then subjected to the error-checking procedure. This sequence of steps may repeat until the combined data packet successfully completes the error-checking procedure.

As used herein, "packet" or "data packet" is meant to be interpreted, as known to those of skill in the art, as (a) a group of logical 1's and 0's that are used to transmit information, and/or (b) a "signal packet" which is a transmitted/received representation of at least one data packet that can be, for example, combined at the receiver according to the present invention.

In communication systems, transmitted data may be received with errors, i.e., the received data may differ from the transmitted data. The ARQ protocol is used to detect, but not correct, any errors in the transmission/reception of data. Typically, data packets incorporate error detection bits so that when a receiver processes a data packet, the error detection bits are checked to determine if the data packet was received correctly. If the packet was received correctly, an acknowledgement signal ("ACK") is sent from the receiver to the transmitter which indicates to the transmitter that the packet was correctly received. If the packet was not received correctly, a negative acknowledgement signal ("NAK") is sent from the receiver to the transmitter which indicates to the transmitter that the packet needs to be retransmitted. In some communication systems, the non-receipt of an ACK by the transmitter within a predetermined amount of time is interpreted the same as the receipt of a NAK, which implies that the transmitter will retransmit the data packet. It shall be understood that any reference to the transmission and/or reception of a NAK includes the situation where an ACK is not transmitted and/or received within a predetermined amount of time.

Certain prior art ARQ systems use a "selective" retransmission scheme, a "traceback" scheme, or a "stop-and-wait" scheme. In an ARQ system with selective retransmission, the transmitter will retransmit those packets for which a NAK (or the lack of an ACK) has been received. In an ARQ system with traceback, the transmitter will retransmit the packet for which a NAK (or the lack of an ACK) has been received and all subsequently-sent packets which were transmitted prior to receiving the NAK (or ACK lack). In an ARQ system employing a "stop-and-wait" scheme, a packet is sent by the transmitter and an ACK must be received by the transmitter before the next packet in the queue is sent.

In noisy communication channels, a large number of retransmissions may occur before data is correctly received. If each received data packet is processed independently at the receiver, the communication system is at the mercy of the noisy environment because the receiver's probability of correctly receiving a given transmitted data packet is the same as the probability of correctly receiving the previously-transmitted version of the data packet. If the receiver combines the energy of the multiple data packets that are received, the probability of correctly receiving the data packet is enhanced with the addition of the energy of each additional data packet received.

Typical prior art communication systems operating with an ARQ protocol may enhance their ability to successfully receive a data packet by combining the energy of previously-received packets with the energy of one or more retransmissions of those packets. This technique is especially useful during operation of the communication system when the energy from a single data packet is insufficient to allow for successful reception of the data packet. Successful receipt of a data packet means that the information contained within the data packet is retrieved from the data packet, i.e., the data packet is demodulated and successfully error checked. Prior art systems which combine the energies of multiple transmissions of a data packet combine the packet energies without regard to the "usability" of the content of the data packet which is typically a function of whether the receiver was synchronized with the transmitter when the data packet was transmitted/received.

Combining the energy of multiple transmissions of a data packet, specifically in an additive white Gaussian noise channel, dramatically improves the probability of receiving the data packet successfully. However, when a receiver's demodulator (e.g., a modem) loses synchronization (i.e., is "out-of-sync") with the transmitter sending the data packet, the packet energy from the transmitted packet has no usable information content and is similar to pure noise from the detection point of view. If the energy of the out-of-sync data packet is added to the energy pool of previously-received transmissions of the same data packet, the out-of-sync data packet will pollute the energy pool thereby preventing successful reception of the data packet until the energy from enough subsequently-retransmitted in-sync data packets are added to the energy pool to overcome the deleterious effect of the out-of-sync data packet. The addition of the energy of an out-of-sync data packet to the energy pool necessitates multiple retransmissions of the data packet to overcome the energy of the out-of-sync data packet which significantly degrades the throughput of the communication system and may completely negate the advantages of combining the energy of retransmitted data packets to ensure successful reception. Prior art communication systems which automatically add the energies of multiple data packet transmissions without regard to the "usability" of the data packet are susceptible to significantly reduced throughput and performance degradation due to the addition of the energy of an out-of-sync packet to the energy pool.

Another problem faced by prior art communication systems which automatically add the energy of multiple transmissions of a data packet is the susceptibility to jamming signals. If a jamming signal is received by the receiver in the place of a retransmission of a data packet, the energy of the jamming signal is then added to the energy pool for the data packet. Since the energy of a jamming signal is typically much greater than the energy of a data packet, the energy pool may be insurmountably polluted and the communication system severely degraded.

Thus there is a need for a communication system using ARQ protocol which can determine whether to add the energy of a received data packet to the energy pool for that data packet and therefor overcome the limitations of the prior art systems and methods.

"The present invention overcomes the limitations of the prior art communication systems by including functionality at the receiver to determine if a received data packet is "usable", e.g., whether the receiver is in sync with the transmitter when the data packet is received. If a data packet is determined to be usable, the energy of the data packet may be summed with the energy of previously-transmitted data packets in order to attempt to successfully receive the data packet, i.e., recover the information in the data packet. If a data packet is determined to be unusable, the energy of the data packet is not added to the energy pool."

One embodiment of the present invention uses a viterbi decoder as part of the signal tracking loop at the receiver. As is known in the art, signal loss detectors can be made by comparing the minimum and maximum path metric of a viterbi decoder. The present invention uses a similar technique to determine whether to keep or discard the energy of a received packet. The minimum and maximum path metrics of a viterbi decoder, such as a short viterbi decoder, are used as a signal quality indicator to determine whether the energy of a received data packet is likely to make the energy pool for that data packet better or worse. If it is determined that the energy of the received data packet will make the energy pool better, the energy is added to the energy pool. On the other hand, if it is determined that the energy of the received data packet will make the energy pool worse, the energy is not added to the energy pool. If the determination is that the energy of the received data packet will make the energy pool worse, the receiver may attempt to decode the data packet by itself.

The present invention operates in a communication system with either selective ARQ protocol or ARQ protocol with traceback.

Accordingly, it is an object of the present invention to obviate many of the above problems in the prior art and to provide a novel system and method for avoiding degradation of an ARQ communication system which combines the energy of multiple data packets.

It is another object of the present invention to provide a novel system and method for determining whether to combine the energy of a received data packet with the energy pool of previously-received versions of the data packet.

It is yet another object of the present invention to provide a novel system and method for improving the throughput of a communication system by receiving a signal containing an encoded data packet in an ARQ-enabled communication system transmitted packetized data from a transmitter to a receiver.

It is still another object of the present invention to provide a novel system and method for using a short viterbi decoder to determine whether to add the energy of a received data packet to the energy pool of previously-received versions for the data packet.

It is a further object of the present invention to provide a novel system and method for using the minimum and maximum path metrics of a viterbi decoder as a signal quality indicator for determining whether to add the data packet energy to a running summation of data packet energy.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

With reference to the drawings, like numerals represent like components throughout the several drawings.

Figure 1:
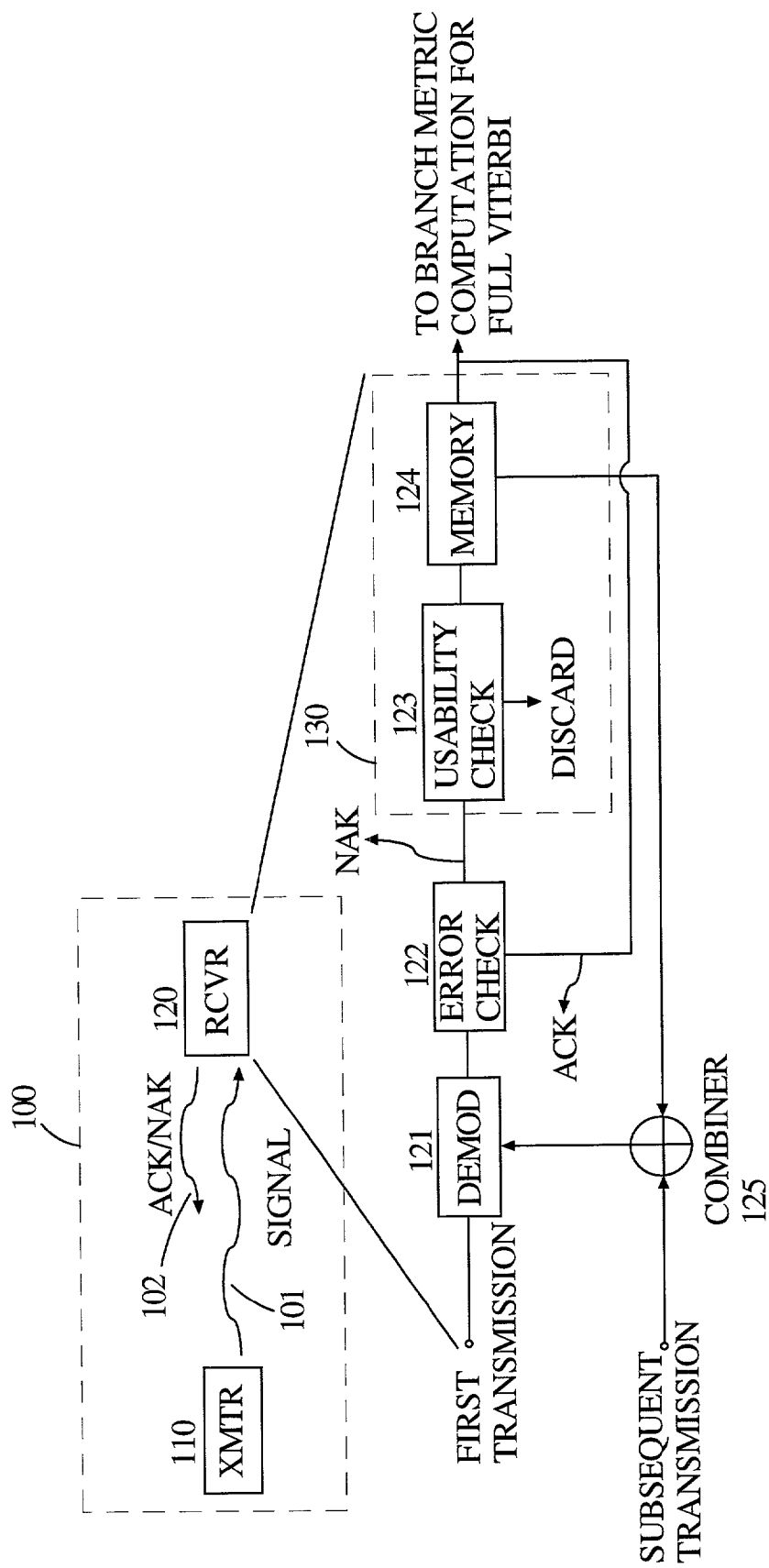
FIG. 1 is a functional block diagram of a communication system detailing the functionality of the receiver according to one embodiment of the present invention.

With attention to FIG. 1, a functional block diagram of one embodiment of an ARQ-enabled communication system 100 is shown. The signal 101 containing encoded data packets is transmitted from the transmitter 110 to the received 120. The receiver is capable of transmitting either an ACK or a NAK signal 102 back to the transmitter in accordance with well-known ARQ protocols. It should be understood that the transmission medium between the transmitter 110 and the receiver 120 may be any type of transmission medium including, but not limited to, wireless, wireline, and fiber optic. Communication channels through a wireless medium may be satellite, short distance line-of-sight, over-the-horizon, or any other channel type. The frequency at which the communication system 100 operates is not limited to any particular frequency band so long as useful information can be transmitted from the transmitter to the receiver. Although FIG. 1 shows a point-to-point communication system, it is to be understood that the communication system 100 is not limited to any particular architecture so long as ARQ protocols can be used between a transmitter and the intended receiver. Therefore the system architecture may be point-to-point, point-to-multipoint, or multipoint-to-multipoint.

The receiver 120 comprises well-known components, not shown for clarity, in addition to the components shown in FIG. 1. As mentioned above, FIG. 1 is a functional block diagram and the receiver 120 is shown with a separate input for a first and subsequent transmissions of a packet. It will be understood by those of skill in the art that one input for all transmissions of a packet is contemplated by the present invention and that the present invention is not to be limited to a receiver having two separate inputs for packet transmissions. The separate transmission inputs are shown in FIG. 1 for the sake of clarity in the discussion of the operation of the invention.

The receiver 120 comprises the demodulator 121, the error checking means 122, the usability checking means 123, the memory 124, and the combiner 125. The usability checking means and the memory are grouped in box 130 and one embodiment of the box 130 will be discussed in further detail with regards to FIG. 3. In operation, the transmitter 110 emits the signal 101 which contains an encoded data packet. The signal 101 is received by the receiver 120. The signal is processed at the receiver as is well known in the art. If the data packet contained within the signal 101 is the first transmission of that data packet to the receiver, the data packet is sent to the demodulator 121 for demodulation. The demodulated data packet is then sent to the error checking means 122. The error checking means can perform any one or more of a number of well-known error checking protocols such as a cyclical redundancy check ("CRC"). If the error checking means determines that the data packet was received correctly, an ACK message is sent from the receiver to the transmitter and the data packet is sent for further processing in the full viterbi decoder, as is well known in the art. If the error checking means determines that the data packet was received incorrectly, a NAK message is sent from the receiver to the transmitter and the data packet is sent to the usability checking means 123. The transmitter 110, upon receipt of the NAK message, retransmits at least the data packet associated with the NAK message, as is known in the art.

The usability checking means 123 determines if the energy of the data packet is "usable", i.e., whether the data packet was received while the transmitter 110 and the receiver 120 were in sync. If the data packet was received while the transmitter and receiver were out of sync, from a detection point of view the data packet is the same as noise. Therefore if the energy of the data packet is added to a pool of energy of subsequent transmissions of the data packet, the energy of the data packet received while the transmitter and receiver were out of sync will be detrimental to the successful demodulation and error checking of the energy pool for the data packet. Consequently, if the usability checking means 123 determines that the data packet is "usable", the data packet is sent to memory 124 for later combining with retransmissions of the data packet. If the usability checking means determines that the data packet is "unusable", the data packet is discarded. The details of the usability checking means will be discussed further below in connection with FIG. 3.

Upon receipt of a NAK signal 102 sent from the receiver 120, the transmitter 110 retransmits the data packet associated with the NAK signal. For purposes of this discussion, it is assumed for the sake of clarity that the ARQ system is a selective ARQ system and only the data packet associated with a NAK signal will be retransmitted. It is to be understood that the assumption of a selective ARQ system is not limiting in any way and that similar principles apply for the present invention in an ARQ system with traceback.

Upon receipt of the retransmitted data packet at the receiver 120, the data packet is processed as is known in the art. The data packet is then sent to the combiner 125 where it is combined with the previous transmission of the data packet that is stored in the memory 124. The combined data packet is then sent to the demodulator 121 and the error checking means 122 in the same way that the initial transmission of the data packet was processed as described above. If the error checking means determines that the combined data packet was received correctly, an ACK message is sent from the receiver to the transmitter and the combined data packet is sent for further processing in the full viterbi decoder, as is well known in the art. If the error checking means determines that the combined data packet was received incorrectly, a NAK message is sent from the receiver to the transmitter and the retransmitted data packet is sent to the usability checking means 123. The transmitter 110, upon receipt of the NAK message, retransmits the data packet associated with the NAK message, as is known in the art.

The usability checking means 123 determines if the energy of the retransmitted data packet is "usable", as discussed above for determining the usability of the initially-transmitted data packet. If the usability checking means 123 determines that the retransmitted data packet is "usable", the retransmitted data packet is sent to memory 124 and is combined with the initially-transmitted data packet, if the initially-transmitted data packet exists in the memory 124. The data packets that are in the memory 124 will them be later combined with subsequent retransmissions of the data packet. If the usability checking means determines that the retransmitted data packet is "unusable", the retransmitted data packet is discarded and the energy of the retransmitted data packet is not added to the energy pool for the data packet. The details of the usability checking means will be discussed further below in connection with FIG. 3.

The above sequence is repeated until the combined data packet, consisting of as many retransmitted data packets as necessary, successfully passes the error-checking means 122 and an ACK signal 102 is sent from the receiver 120 to the transmitter 110.

In a preferred embodiment, if the retransmitted data packet fails the error checking step but successfully passes the usability step, the retransmitted data packet is stored in the memory 124 and the previously-stored data packet, if one exists, is removed from memory. This scheme is useful if the memory 124 is limited to only one storage location for the data packet. Otherwise, the each data packet may be stored separately or the combined data packet may be stored in the memory 124.

Figure 2:
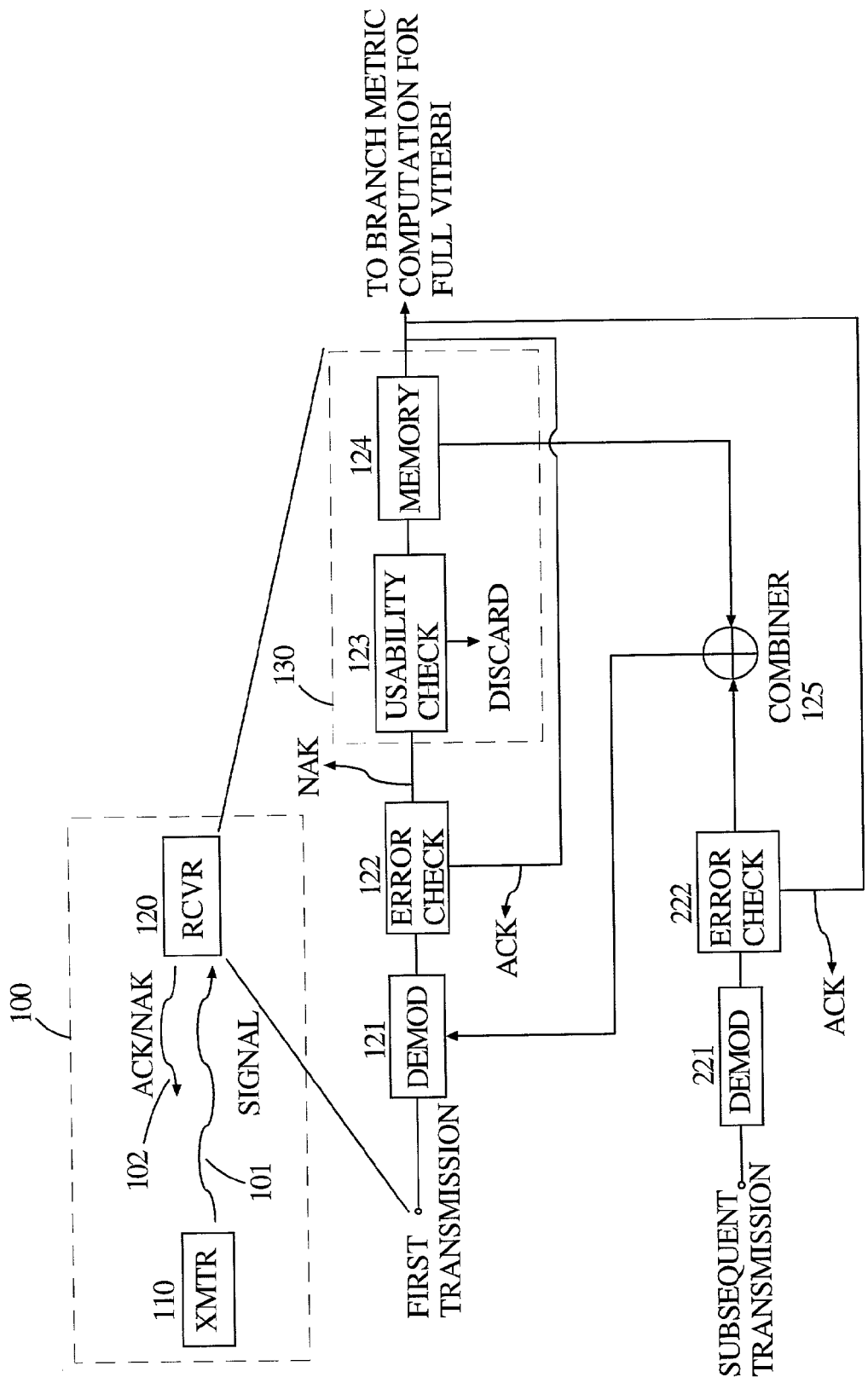
FIG. 2 is a functional block diagram of a communication system detailing the functionality of the receiver according to a second embodiment of the present invention.

With attention now to FIG. 2, a functional block diagram of a communication system is depicted detailing the functionality of the receiver according to a second embodiment of the present invention. The operation of the communication system shown in FIG. 2 is similar to the operation of the communication system shown in FIG. 1 except as discussed below. FIG. 2 is a functional block diagram, as is FIG. 1, and the receiver 120 is shown with a separate input for a first and subsequent transmissions of a packet. Additionally, the receiver 120 is shown with two demodulators, 121 and 221 as well as two error-checking means 122 and 222. It will be understood by those of skill in the art that one input for all transmissions of a packet as well as one demodulator and one error-checking means is contemplated by the present invention and that the present invention is not to be limited to a receiver having two separate inputs for packet transmissions and or two separate demodulators and/or two separate error-checking means. The separate transmission inputs, separate demodulators, and separate error-checking means are shown in FIG. 2 for the sake of clarity in the discussion of the operation of the invention.

In operation, the receiver 120 of FIG. 2 receives subsequent transmissions of the data packet, i.e., retransmitted data packets, and demodulates and error checks the retransmitted data packet at the demod 221 and the error-checking means 222, respectively, prior to combining the retransmitted data packet, if the error check fails, with any previously-received and stored data packets in the memory 124. Otherwise, the operation of the communication system of FIG. 2 is as described above for FIG. 1.

Figure 3:
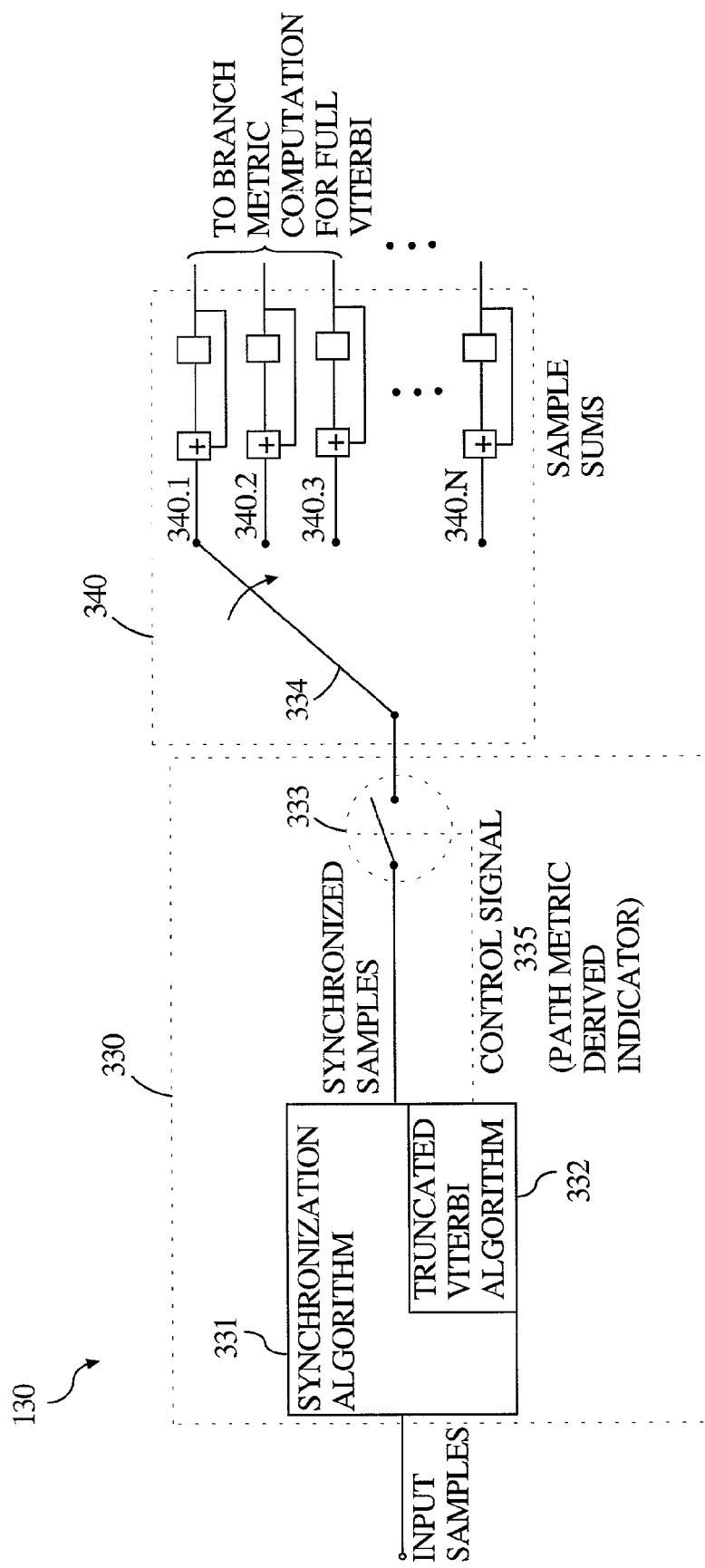
FIG. 3 is a functional block diagram of the usability checking means and the memory means of the receiver.

Attention is now drawn to FIG. 3 which is a depiction of a functional block diagram of the usability checking means 123 and memory 124 of FIGS. 1 and 2, also denoted collectively as box 130. The functional blocks of box 130 are the block 330 containing the synchronization algorithm 331, the truncated viterbi algorithm 332, and a first switch 333, which correlate to the usability checking means 123 in FIGS. 1 and 2, and the block 340 containing a second switch 334, and the sample sums 340, which correlates to the memory 124 in FIGS. 1 and 2.

In operation, an input sample, e.g., a data packet, is sent from the output of the error-checking means 122 in FIG. 1, for example, when the data packet fails the error-checking procedure. The synchronization algorithm 331 includes a truncated, or "short", viterbi algorithm which is used to make symbol decisions for the tracking loop of the receiver. In accordance with the present inventive system and method, a control signal from the truncated viterbi algorithm is used to control the opening and closing of the switch 333. The control signal is derived from, for example, a comparison of the minimum and maximum path metrics from the truncated viterbi algorithm. If the synchronization algorithm, including the truncated viterbi algorithm, determines that the receiver is not in sync with the transmitter, i.e., the data packet is "unusable", the control signal 335 opens the switch 333 and the data packet (sample) is discarded. If the synchronization algorithm, including the truncated viterbi algorithm, determines that the receiver is in sync with the transmitter, i.e., the data packet is "usable", the control signal 335 shuts the switch 333 and the data packet is sent to the block 340 for addition to memory.

Block 340 includes samples sums, which comprise an energy pool for those data packets that are determined to be usable by the truncated viterbi algorithm. While only a few blocks are shown for storing data packets, it is to be understood that the practice of the present invention is not limited to one, or a few, storage bins for data packets. The present invention can be practiced with any number of storage bins for data packets. The switch 334 is operated so that the initial and retransmission data packets for, say, data packet A are not intermixed with data packets associated with data packets B, C, etc. The outputs of the memory block 340 are connected to a full viterbi decoder for branch metric computation as is well known in the art.

Figure 4:
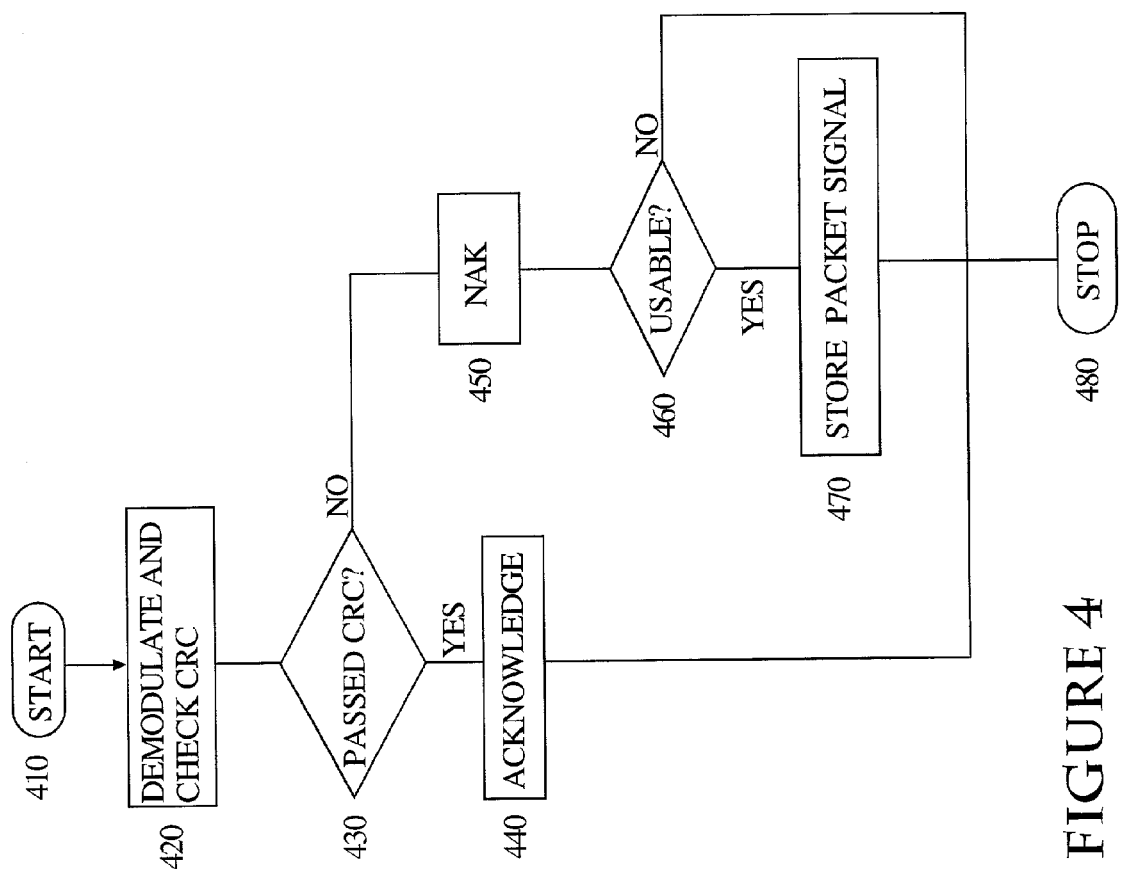
FIG. 4 is a flow chart showing the sequence of steps performed at the receiver upon receipt of an initial transmission of a data packet.

Attention is now drawn to the remaining Figures. FIGS. 4 through 8 are flow charts showing the sequence of steps for the invention. FIG. 4 depicts the process for the initial transmission of a particular data packet from a transmitter to a receiver. FIGS. 5 through 8 depict separate embodiments for subsequent retransmissions of the particular data packet if retransmission is necessary. The processes depicted in FIGS. 5 through 8 are for each retransmitted data packet and may be repeated for each occurrence of a retransmitted data packet. For the FIGS. 4 through 8, like numerals represent like process steps.

FIG. 4 is a flow chart showing the sequence of steps performed at the receiver upon receipt of an initial transmission of a data packet according to the present invention. The process starts at block 410 when the initial transmission of a data packet is received by a receiver, such as the receiver 120 in FIGS. 1 and 2. The data packet passes to block 420 where the data packet is demodulated and error checked, such as by a cyclic redundancy check ("CRC") protocol. If the data packet is determined, at block 430, to not have any errors, the data packet is passed on for further processing in accordance with well known procedures in the art, an acknowledgement signal ("ACK") is sent at block 440 from the receiver to the transmitter and the process ends at block 480. If the data packet is determined, at block 430, to have errors, a non-acknowledgement signal ("NAK") is sent at block 450 from the receiver to the transmitter and the data packet is passed to block 460 for a usability check. If the data packet is determined to be usable, the data packet is stored at block 470 and the process ends at block 480. If the data packet is determined to be unusable, the data packet is not stored, i.e., it is discarded, and the process ends at block 480.

Figure 5:
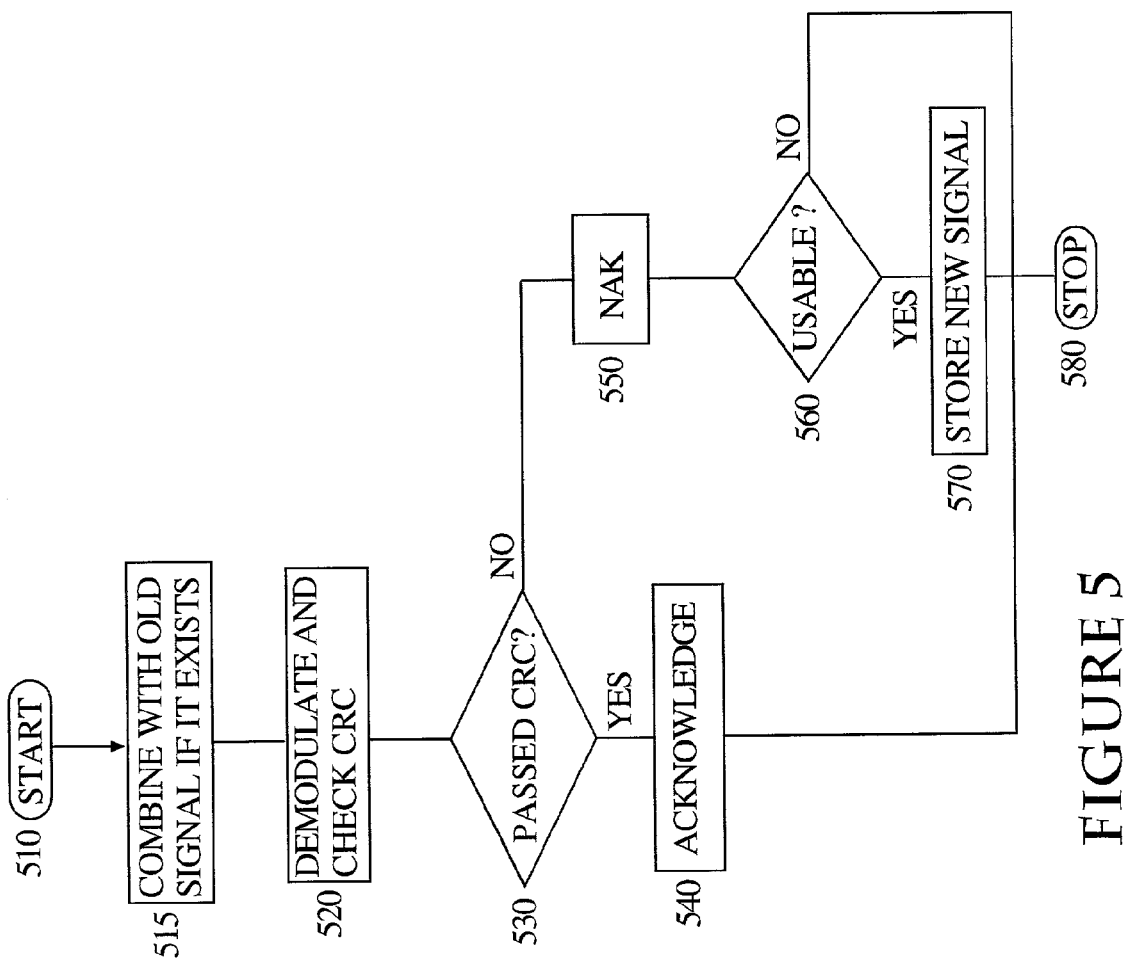
FIG. 5 is a flow chart showing the sequence of steps performed at the receiver for a first embodiment of the invention upon receipt of a retransmitted data packet.

FIG. 5 is a flow chart showing the sequence of steps performed at the receiver for a first embodiment of the invention upon receipt of a retransmitted data packet. The operation of the process depicted in FIG. 5 is similar to the process depicted in FIG. 4 with the following exceptions. Since the process in FIG. 5 is for the retransmission of a data packet, one of skill in the art would understand that the retransmission may be in response to a NAK sent at block 450 in FIG. 4 dealing with the initial transmission of the data packet or in response to a NAK sent at block 550 in FIG. 5 during a previously-completed retransmission process show in FIG. 5. In the interest of clarity, the following discussion will assume that the retransmitted data packet is the first retransmission after the initial transmission of the data packet and is not to be construed as limiting the invention in any way.

In FIG. 5, the process starts at block 510 when the retransmission of a data packet is received by a receiver. At block 515 the retransmitted data packet is combined with the stored data packet from block 470 in FIG. 4 and the combined data packet is demodulated and error checked at block 520. If, at block 530, the combined data packet is determined to not have any errors, the combined data packet is passed on for further processing in accordance with well known procedures in the art, an acknowledgement signal ("ACK") is sent at block 540 from the receiver to the transmitter and the process ends at block 580. If, at block 530, the data packet is determined to have errors, a non-acknowledgement signal ("NAK") is sent at block 550 from the receiver to the transmitter and the retransmitted data packet is passed to block 560 for a usability check. If the retransmitted data packet is determined to be usable, the retransmitted data packet is stored at block 570 and the process ends at block 580. If the retransmitted data packet is determined to be unusable, the retransmitted data packet is not stored, i.e., it is discarded, and the process ends at block 580. It is to be understood that the process of FIG. 5 may be repeated as necessary to permit the data packet to successfully pass the error checking step at block 530.

Figure 6:
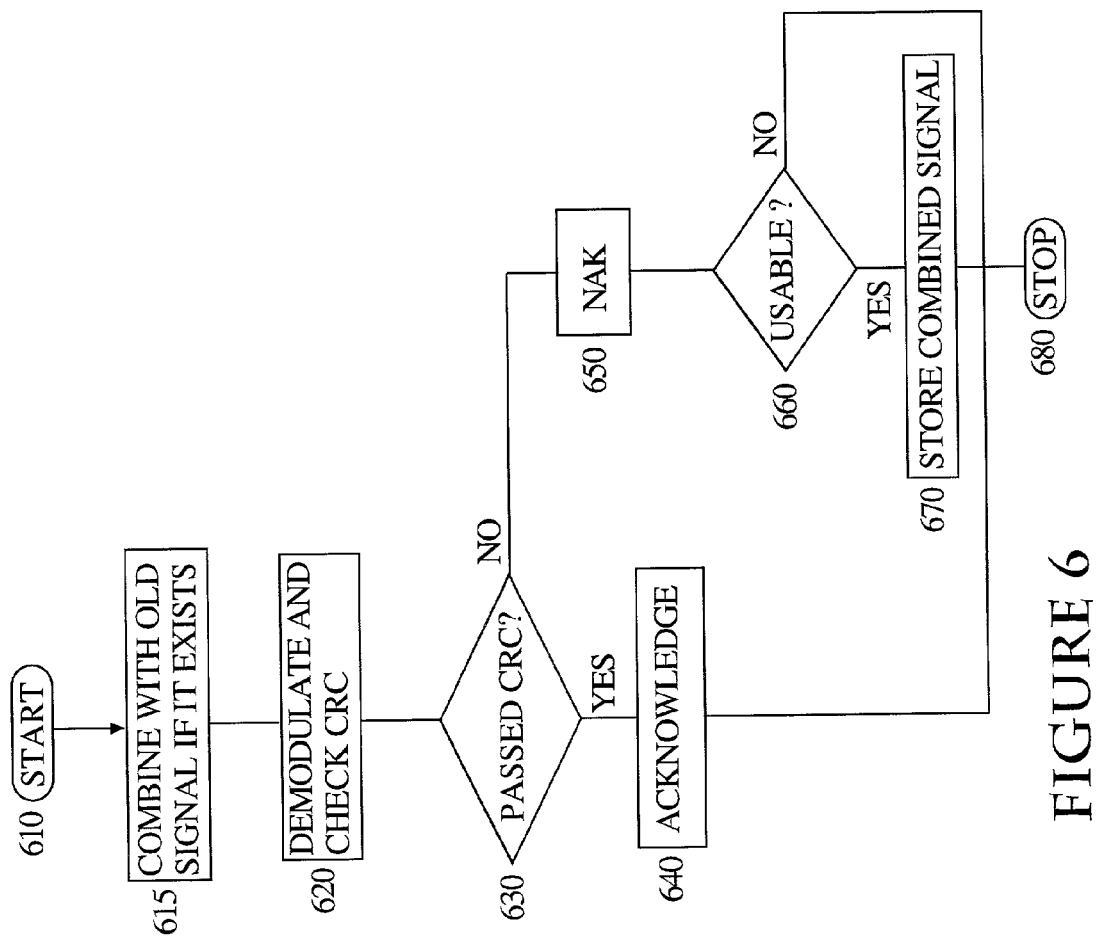
FIG. 6 is a flow chart showing the sequence of steps performed at the receiver for a second embodiment of the invention upon receipt of a retransmitted data packet.

Directing attention now to FIG. 6, a second embodiment of the present invention as it relates to the procedure for processing retransmitted data packets is depicted. It will be noted that the process steps are the same in FIGS. 5 and 6 with one exception. The difference between the processes in FIGS. 5 and 6 occurs at blocks 570 and 670, respectively. Whereas for block 570 in FIG. 5 the retransmitted signal was stored in memory, at block 670 in FIG. 6 the combined signal is stored in memory, i.e., the energy of the retransmitted data packet is added to the energy pool for that data packet, e.g., the energy of the initially transmitted data packet. It is to be understood that the process of FIG. 6 may be repeated as necessary to permit the data packet to successfully pass the error checking step at block 630.

Figure 7:
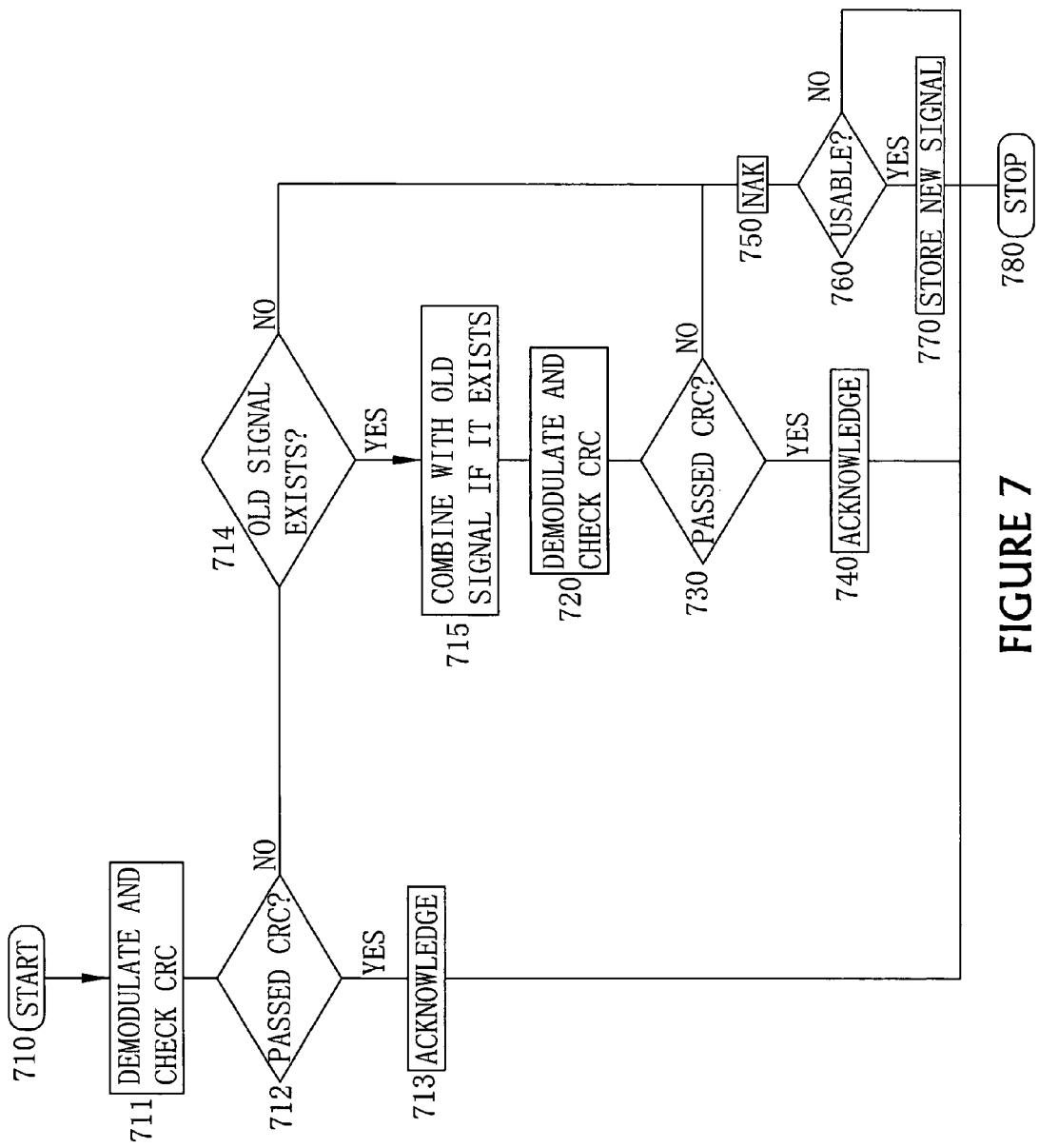
FIG. 7 is a flow chart showing the sequence of steps performed at the receiver for a third embodiment of the invention upon receipt of a retransmitted data packet.

FIG. 7 is a flow chart showing the sequence of steps performed at the receiver for a third embodiment of the invention upon receipt of a retransmitted data packet. As with the discussion of FIG. 6, the discussion of FIG. 7 will be directed towards a first retransmission of a data packet and, as discussed above, should not be construed as limiting the invention in any way. As with FIGS. 4, 5, and 6, like numerals represent like process steps.

The process embodied in FIG. 7 begins at block 710 with the retransmission of a data packet. The retransmitted data packet is then demodulated and error checked at block 711. If, at block 712, the retransmitted data packet is determined to not have any errors, the retransmitted data packet is passed on for further processing in accordance with well known procedures in the art, an acknowledgement signal ("ACK") is sent at block 713 from the receiver to the transmitter and the process ends at block 780. If, at block 712, the retransmitted data packet is determined to have errors, a determination is made at block 714 as to whether a stored data packet exists. If a stored data packet does not exist, a non-acknowledgement signal ("NAK") is sent at block 750 from the receiver to the transmitter and the retransmitted data packet is passed to block 760 for a usability check consistent with the process described above in FIG. 5. If a stored data packet does exist, the retransmitted data packet is combined with the stored data packet at block 715 and the combined data packet is sent to block 720 for demodulation and error checking. The remaining process steps in FIG. 7 are similar to the process steps described above in the discussion of FIG. 5. At block 770, as for block 570 in FIG. 5, the retransmitted data packet (new signal) is stored. It is to be understood that the process of FIG. 7 may be repeated as necessary to permit the retransmitted data packet to successfully pass the error checking step at block 712 or the combined data packet to successfully pass the error checking step at block 730.

Figure 8:
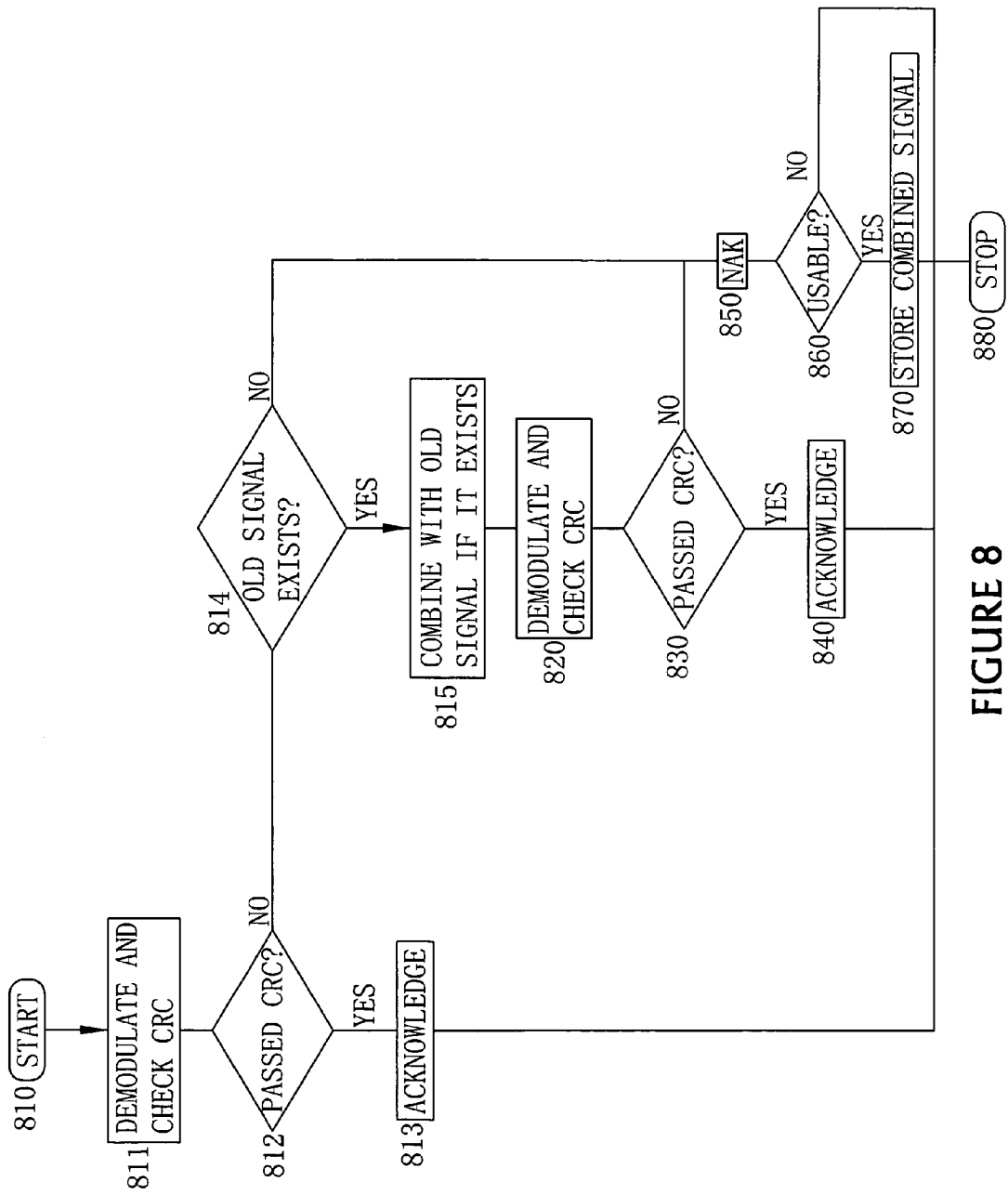
FIG. 8 is a flow chart showing the sequence of steps performed at the receiver for a fourth embodiment of the invention upon receipt of a retransmitted data packet.

Directing attention now to FIG. 8, a fourth embodiment of the present invention as it relates to the procedure for processing retransmitted data packets is depicted. It will be noted that the process steps are the same in FIGS. 7 and 8 with one exception. The difference between the processes in FIGS. 7 and 8 occurs at blocks 770 and 870, respectively. Whereas for block 770 in FIG. 7 the retransmitted signal or new signal was stored in memory, at block 870 in FIG. 8 the combined signal is stored in memory, i.e., the energy of the retransmitted data packet is added to the energy pool for that data packet, e.g., the energy of the initially transmitted data packet. It is to be understood that the process of FIG. 8 may be repeated as necessary to permit the retransmitted data packet to successfully pass the error checking step at block 812 or the combined data packet to successfully pass the error checking step at block 830.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A method of receiving a signal containing an encoded data packet in an ARQ-enabled communication system transmitting packetized data from a transmitter to a receiver comprising the steps of:
    (a) receiving, demodulating, and error checking said signal;
    (b) performing a usability check on said encoded data packet in said signal in response to an error condition in the error-checking step;
    (c) storing the signal as received containing said encoded data packet in response to a positive usability condition;
    (d) receiving a retransmission of the signal containing the encoded data packet;
    (e) combining the stored signal as received containing the encoded data packet with the retransmitted signal containing the encoded data packet; and
    (f) demodulating the combined signal to thereby obtain the data packet.

2. The method of claim 1 wherein the step of combining signals containing the encoded data packets comprises coherently adding the signals containing the data packets.

3. The method of claim 1 wherein the ARQ-enabled communication system is a traceback system.

4. The method of claim 1 wherein the ARQ-enabled communication system is a stop-and-wait system.

5. The method of claim 1 wherein step (a) includes the following step:
    (i) in response to a no error condition in the error-checking step of said encoded data packet, sending an acknowledgement signal from the receiver to the transmitter.

6. The method of claim 5 replacing step (f) with the following steps:
    (f) demodulating the combined signals containing the encoded data packet; and
    (g) repeating steps (b) through (f) using the combined data packet as the signal as received containing the encoded data packet until an acknowledgment signal is sent from the receiver to the transmitter to thereby receive said data packet at the receiver.

7. The method of claim 1 wherein steps (b) and (c) are replaced with the following steps:
    (b) in response to an error condition in the error-checking step of said encoded data packet, performing the following steps:
        (i) sending a negative acknowledgment signal from the receiver to the transmitter; and
        (ii) performing a usability check on said encoded data packet;
            (1) in response to a positive usability condition in the usability-checking step of said encoded data packet, storing the signal as received containing said encoded data packet at the receiver to thereby create a first stored data packet if no first stored data packet exists, otherwise storing said combined data packet from step (e) as said first stored data packet; and
            (2) in response to a non-positive usability condition in the usability-checking step of said encoded data packet, discarding said signal as received containing the encoded data packet.

8. The method of claim 7 wherein step (e) comprises the following steps:
    (i) copying said retransmitted signal containing the encoded data packet and storing said copy of said retransmitted signal containing the encoded data packet to thereby create a second stored data packet; and
    (ii) combining said second stored data packet with said first stored data packet to thereby create a combined data packet if said first stored data packet exists, otherwise using said second stored data packet as said combined data packet.

9. The method of claim 1 wherein steps (b) and (c) are replaced with the following steps:
 (b) in response to an error condition in the error-checking step of said encoded data packet, performing the following steps:
  (i) sending a negative acknowledgment signal from the receiver to the transmitter; and
  (ii) performing a usability check on said encoded data packet;
   (1) in response to a positive usability condition in the usability-checking step of said encoded data packet, storing the signal as received containing said encoded data packet at the receiver to thereby create a first stored data packet; and
   (2) in response to a non-positive usability condition in the usability-checking step of said encoded data packet, discarding said signal as received containing the encoded data packet.

10. The method of claim 9 wherein step (e) comprises the following steps:
 (i) receiving at the receiver a retransmission of said encoded data packet contained in said signal in step (a) in response to receipt at the transmitter of said negative acknowledgement signal; and
 (ii) combining said retransmitted signal containing the encoded data packet with said first stored data packet to thereby create a combined data packet if said first stored data packet exists, otherwise using said retransmitted signal containing the encoded data packet as said combined data packet.

11. A receiver for receiving a signal containing an encoded data packet in an ARQ-enabled communication system transmitting packetized data from a transmitter to a receiver comprising:
 (a) a demodulator and error checking means for demodulating and error checking a signal as received containing an encoded data packet;
 (b) usability checking means for performing a usability check on said encoded data packet in response to an error condition output from said error-checking means;
 (c) memory for storing the signal as received containing said encoded data packet in response to a positive usability condition; and
 (d) combining means for combining the stored signal as received containing the data packet with a received retransmitted signal containing said encoded data packet,
 whereby the demodulator demodulates the combined data packet to thereby receive the data packet.

12. The receiver of claim 11 wherein the combining means comprises means for coherently adding the signals containing the encoded data packets.

13. The receiver of claim 11 wherein the ARQ-enabled communication system is a traceback system.

14. The receiver of claim 11 wherein the ARQ-enabled communication system is a stop-and-wait system.

15. A method of communicating a signal containing an encoded data packet in an ARQ-enabled communication system transmitting packetized data from a transmitter to a receiver comprising the steps of:
 (a) receiving said signal containing an encoded data packet at the receiver;
 (b) demodulating said signal as received;
 (c) performing an error check on said encoded data packet;
  (i) in response to a no error condition in the error-checking step of said encoded data packet, sending an acknowledgement signal from the receiver to the transmitter;
  (ii) in response to an error condition in the error-checking step of said encoded data packet, performing the following steps:
   (1) sending a negative acknowledgment signal from the receiver to the transmitter;
   (2) performing a usability check on said encoded data packet;
    (A) in response to a positive usability condition in the usability-checking step of said encoded data packet, storing signal as received containing the encoded data packet at the receiver to thereby create a first stored data packet if no first stored data packet exists, otherwise storing said second stored data packet from step (c)(ii)(4) as said first stored data packet;
    (B) in response to a non-positive usability condition in the usability-checking step of said encoded data packet, discarding said encoded data packet;
   (3) receiving at the receiver a retransmission of the signal containing said encoded data packet of step (a) in response to receipt at the transmitter of said negative acknowledgement signal;
   (4) copying said retransmitted signal containing the encoded data packet and storing said copy of said retransmitted signal containing the encoded data packet to thereby create a second stored data packet;
   (5) combining said retransmitted signal containing the encoded data packet with said first stored data packet to thereby create a combined data packet if said first stored data packet exists, otherwise using said retransmitted signal containing the encoded data packet as said combined data packet;
   (6) demodulating said combined data packet;
 (d) repeating step (c) using the combined data packet as the encoded data packet until an acknowledgment signal is sent from the receiver to the transmitter to thereby communicate said data packet from the transmitter to the receiver.

16. A method of communicating a signal containing an encoded data packet in an ARQ-enabled communication system transmitting packetized data from a transmitter to a receiver comprising the steps of:
 (a) receiving said signal containing an encoded data packet at the receiver;
 (b) demodulating said signal as received;
 (c) performing an error check on said encoded data packet;
  (i) in response to a no error condition in the error-checking step of said encoded data packet, sending an acknowledgement signal from the receiver to the transmitter;
  (ii) in response to an error condition in the error-checking step of said encoded data packet, performing the following steps:
   (1) sending a negative acknowledgment signal from the receiver to the transmitter;
   (2) performing a usability check on said encoded data packet;
    (A) in response to a positive usability condition in the usability-checking step of said encoded data packet, storing said signal as received containing the encoded data packet at the receiver to thereby create a first stored data packet;
(B) in response to a non-positive usability condition in the usability-checking step of said encoded data packet, discarding said encoded data packet;
(3) receiving at the receiver a retransmission of said encoded data packet contained in said signal in step (a) in response to receipt at the transmitter of said negative acknowledgement signal;
(4) combining said retransmitted encoded data packet with said first stored data packet to thereby create a combined data packet if said first stored data packet exists, otherwise using said retransmitted data packet as said combined data packet;
(5) demodulating said combined data packet;
(d) repeating step (c) using the combined data packet as the encoded data packet until an acknowledgment signal is sent from the receiver to the transmitter to thereby communicate said data packet from the transmitter to the receiver.

17. A method of communicating a signal containing an encoded data packet in an ARQ-enabled communication system transmitting packetized data from a transmitter to a receiver comprising the steps of:
(a) receiving, demodulating, and error checking said signal;
(b) performing a usability check on said encoded data packet in said signal in response to an error condition in the error-checking portion of step (a);
(c) storing the signal as received containing said encoded data packet in response to a positive usability condition;
(d) receiving and error checking a retransmission of the signal containing the encoded data packet;
(e) combining the stored signal as received containing the data packet with the retransmitted signal containing the data packet in response to an error condition in the error checking portion of step (d) creating a combined data packet, otherwise transmit an acknowledgement from the receiver to the transmitter;
(f) error checking the combined data packet;
(g) performing a usability check on said combined data packet in response to an error condition in step (f), otherwise transmit an acknowledgement from the receiver to the transmitter; and
(h) repeating steps (d) through (g) until an acknowledgement is sent thereby transmitting said encoded data packet from the transmitter to the receiver.

18. The method of claim 17 wherein the step of combining data packets comprises coherently adding the signals containing the encoded data packets.

19. The method of claim 17 wherein the ARQ-enabled communication system is a traceback system.

20. The method of claim 17 wherein the ARQ-enabled communication system is a stop-and-wait system.

21. A communication system for transmitting a signal containing an encoded data packet in an ARQ-enabled communication system transmitting packetized data from a transmitter to a receiver comprising:
(a) a receiver for receiving, demodulating, and error checking said signal;
(b) usability checking means for performing a usability check on said encoded data packet in said signal in response to an error condition in the error-checking portion of step (a);
(c) memory for storing said signal as received containing the encoded data packet in response to a positive usability condition;
(d) said receiver for receiving and error checking a retransmission of the encoded data packet;
(e) combining means for combining the stored data packet with the retransmitted data packet in response to an error condition in the error check of the retransmission of the encoded data packet;
(f) transmitter means at the receiver for transmitting an acknowledgement from the receiver to the transmitter in response to a no-error condition in the error check of the retransmission of the encoded data packet;
(g) said error checking means for error checking the combined data packet;
(h) said usability checking means for performing a usability check on said combined data packet in response to an error condition in step (g);
(i) said transmitter means for transmitting an acknowledgement from the receiver to the transmitter in response to a no-error condition in the error check of the retransmission of the encoded data packet; and
(j) means for repeating steps (d) through (g) until an acknowledgement is sent thereby transmitting said encoded data packet from the transmitter to the receiver.

22. The system of claim 21 wherein the combining means comprises means for coherently adding the encoded data packets.

23. The system of claim 21 wherein the ARQ-enabled communication system is a traceback system.

24. The system of claim 21 wherein the ARQ-enabled communication system is a stop-and-wait system.

25. A method of communicating a signal containing an encoded data packet in an ARQ-enabled communication system transmitting packetized data from a transmitter to a receiver comprising the steps of:
(a) receiving said signal containing an encoded data packet at the receiver;
(b) demodulating said signal as received;
(c) performing an error check on said encoded data packet;
(i) in response to a no error condition in the error-checking step of said encoded data packet, sending an acknowledgement signal from the receiver to the transmitter;
(ii) in response to an error condition in the error-checking step of said encoded data packet, performing the following steps:
(1) sending a negative acknowledgment signal from the receiver to the transmitter;
(2) performing a usability check on said encoded data packet;
(A) in response to a positive usability condition in the usability-checking step of said encoded data packet, storing the signal as received containing said encoded data packet at the receiver to thereby create a first stored data packet;
(B) in response to a non-positive usability condition in the usability-checking step of said encoded data packet, discarding said signal as received containing said encoded data packet;
(3) receiving at the receiver a retransmission of the signal containing said encoded data packet of step (a) in response to receipt at the transmitter of said negative acknowledgement signal;

(4) copying said retransmitted signal containing the encoded data packet and storing said copy of said retransmitted signal containing the encoded data packet to thereby create a second stored data packet;
(5) performing an error check on the encoded data packet containing the retransmitted signal;
  (A) in response to a no error condition in the error-checking step of said encoded data packet, sending an acknowledgement signal from the receiver to the transmitter;
  (B) in response to an error condition in the error-checking step of said encoded data packet, performing the following steps:
    (I) determining if said first stored data packet exists;
    (II) sending a negative acknowledgement from the receiver to the transmitter if no first stored data packet exists;
    (III) performing the following steps if said first stored data packet exists:
      (aa) combining said retransmitted signal containing the encoded data packet with said first stored data packet to thereby create a combined data packet;
      (bb) performing an error check on said combined data packet;
        (AA) in response to a no error condition in the error-checking step of said combined data packet, sending an acknowledgement signal from the receiver to the transmitter;
        (BB) in response to an error condition in the error-checking step of said combined data packet, sending a negative acknowledgement signal from the receiver to the transmitter;
    (IV) performing a usability check on said combined data packet:
      (aa) in response to a positive usability condition in the usability-checking step of said combined data packet, storing said second stored data packet as said first stored data packet;
      (bb) in response to a non-positive usability condition in the usability-checking step of said combined data packet, discarding said combined data packet;
(6) repeating steps (3) through (5) until an acknowledgement signal is sent from the receiver to the transmitter to thereby communication said data packet from the transmitter to the receiver.

26. A method of communicating a signal containing an encoded data packet in an ARQ-enabled communication system transmitting packetized data from a transmitter to a receiver comprising the steps of:
(a) receiving said signal containing an encoded data packet at the receiver;
(b) demodulating said signal as received;
(c) performing an error check on said encoded data packet;
  (i) in response to a no error condition in the error-checking step of said encoded data packet, sending an acknowledgement signal from the receiver to the transmitter;
  (ii) in response to an error condition in the error-checking step of said encoded data packet, performing the following steps:
    (1) sending a negative acknowledgment signal from the receiver to the transmitter;
    (2) performing a usability check on said encoded data packet;
      (A) in response to a positive usability condition in the usability-checking step of said encoded data packet, storing the signal as received containing said encoded data packet at the receiver to thereby create a first stored data packet;
      (B) in response to a non-positive usability condition in the usability-checking step of said encoded data packet, discarding said signal as received containing the encoded data packet;
    (3) receiving at the receiver a retransmission of the signal containing said encoded data packet of step (a) in response to receipt at the transmitter of said negative acknowledgement signal;
    (4) performing an error check on the encoded data packet contained in the retransmitted signal;
      (A) in response to a no error condition in the error-checking step of said encoded data packet, sending an acknowledgement signal from the receiver to the transmitter;
      (B) in response to an error condition in the error-checking step of said encoded data packet, performing the following steps:
        (I) determining if said first stored data packet exists;
        (II) sending a negative acknowledgement from the receiver to the transmitter if no first stored data packet exists;
        (III) performing the following steps if said first stored data packet exists:
          (aa) combining said retransmitted signal containing the encoded data packet with said first stored data packet to thereby create a combined data packet;
          (bb) performing an error check on said combined data packet;
            (AA) in response to a no error condition in the error-checking step of said combined data packet, sending an acknowledgement signal from the receiver to the transmitter;
            (BB) in response to an error condition in the error-checking step of said combined data packet, sending a negative acknowledgement signal from the receiver to the transmitter;
        (IV) performing a usability check on said combined data packet:
          (aa) in response to a positive usability condition in the usability-checking step of said combined data packet, storing said combined data packet as said first stored data packet;
          (bb) in response to a non-positive usability condition in the usability-checking step of said combined data packet, discarding said combined data packet;
    (5) repeating steps (3) through (5) until an acknowledgement signal is sent from the receiver to the transmitter to thereby communication said data packet from the transmitter to the receiver.

27. In a method for communicating a signal containing an encoded data packet in an ARQ-enabled communication system transmitting packetized data from a transmitter to a receiver, the improvement wherein a usability check is performed on the received encoded data packet to determine whether the energy of the received encoded data packet is to be used to demodulate the received packet; wherein the usability check comprises a comparison of minimum and maximum path metrics of a short viterbi decoder or truncated viterbi algorithm.

28. The method of claim 27 wherein the ARQ-enabled communication system is a traceback system.

29. The method of claim 27 wherein the ARQ-enabled communication system is a stop-and-wait system.

30. A method of receiving a signal containing an encoded data packet in an ARQ-enabled communication system transmitting packetized data from a transmitter to a receiver comprising the steps of:
 (a) receiving, demodulating, and error checking said signal;
 (b) comparing the minimum and maximum path metrics of a short viterbi decoder of said encoded data packet in said signal in response to an error condition in the error-checking step;
 (c) storing the signal as received containing said encoded data packet in response to a favorable comparision;
 (d) receiving a retransmission of the signal containing the encoded data packet;
 (e) combining the stored signal as received containing the encoded data packet with the retransmitted signal containing the encoded data packet; and
 (f) demodulating the combined signal to thereby obtain the data packet.

31. A method of communicating a signal containing an encoded data packet in an ARQ-enabled communication system transmitting packetized data from a transmitter to a receiver comprising the steps of:
 (a) receiving, demodulating, and error checking said signal;
 (b) comparing the minimum and maximum path metrics of a short viterbi decoder of said encoded data packet in said signal in response to an error condition in the error-checking step (a);
 (c) storing the signal as received containing said encoded data packet in response to a positive comparision condition;
 (d) receiving and error checking a retransmission of the signal containing the encoded data packet;
 (e) combining the stored signal as received containing the data packet with the retransmitted signal containing the data packet in response to an error condition in the error checking portion of step (d) creating a combined data packet, otherwise transmit an acknowledgement from the receiver to the transmitter;
 (f) error checking the combined data packet;
 (g) comparing the minimum and maximum path metrics of a short viterbi decoder of said combined data packet in response to an error condition in step (f), otherwise transmit an acknowledgement from the receiver to the transmitter; and
 (h) repeating steps (d) through (g) until an acknowledgement is sent thereby transmitting said encoded data packet from the transmitter to the receiver.

* * * * *